United States Patent
Lin (10) Patent No.: US 6,988,048 B2
(45) Date of Patent: Jan. 17, 2006

(54) PORTABLE COMPUTER AND SYSTEM CONTROLLING METHOD THEREOF

(75) Inventor: Wen-Yen Lin, Taoyuan (TW)

(73) Assignee: Quanta Computer Inc., Tao Yuan Shien (TW)

(*) Notice: Subject to any disclaimer, the term of this patent is extended or adjusted under 35 U.S.C. 154(b) by 0 days.

(21) Appl. No.: 10/874,847

(22) Filed: Jun. 23, 2004

(65) Prior Publication Data

US 2004/0267990 A1    Dec. 30, 2004

(30) Foreign Application Priority Data

Jun. 24, 2003    (TW) ................... 92117079

(51) Int. Cl.
*G01K 1/08*        (2006.01)
*G06F 15/00*    (2006.01)

(52) U.S. Cl. .................................. 702/132

(58) Field of Classification Search ........ 702/182–184, 702/186, 191, 193, 195; 361/1, 679, 688, 361/690, 695, 687, 686, 691–694; 700/299, 700/300, 21

See application file for complete search history.

(56) References Cited

U.S. PATENT DOCUMENTS

| | | | |
|---|---|---|---|
| 6,194,858 B1 * | 2/2001 | Chen | 318/473 |
| 6,867,971 B2 * | 3/2005 | Lai | 361/697 |
| 2003/0128509 A1 * | 7/2003 | Oudet | 361/687 |

* cited by examiner

*Primary Examiner*—Michael Nghiem
*Assistant Examiner*—Demetrius Pretlow
(74) *Attorney, Agent, or Firm*—Thomas, Kayden, Horstemeyer & Risley (57) ABSTRACT

A portable computer and system controlling method thereof. The portable computer includes a heat dissipating module, a microphone, a spectrum analysis module, and a controlling module. The heat dissipating module has a fan module. The fan module has a corresponding system acoustic level. The microphone collects surrounding noises, acoustically isolated from the fan module. The spectrum analysis module is connected to the microphone, analyzing the surrounding noises collected from the microphone to obtain a surrounding acoustic level. The controlling module has a predetermined temperature of the element, connected to the heat dissipating module and the spectrum analysis module, respectively. The predetermined temperature of the element substitutes for the maximum temperature, and the surrounding acoustic level substitutes for the maximum system acoustic level. An executive operating status is selected from a plurality of operating statuses, thereby obtaining corresponding system efficiency and fan driving voltage.

20 Claims, 9 Drawing Sheets

PORTABLE COMPUTER AND SYSTEM CONTROLLING METHOD THEREOF

BACKGROUND OF THE INVENTION

1. Field of the Invention

The present invention relates to a portable computer with negligible noise level, and in particular to a portable computer utilizing a system controlling method, determining appropriate fan driving voltage and system efficiency according to surrounding acoustic level.

2. Description of the Related Art

As processing speeds of central processor unit (CPU), a chipset, a graphics processing unit (GPU), an accelerated graphics port (AGP), or dynamic random access memory (DRAM) in an electronic device such as a notebook have increased considerably, and such elements are disposed on different areas of a motherboard, energy density has increased accordingly. Due to such designs, a fan controlling system is required to control heat dissipation in the notebook.

Figure 1:
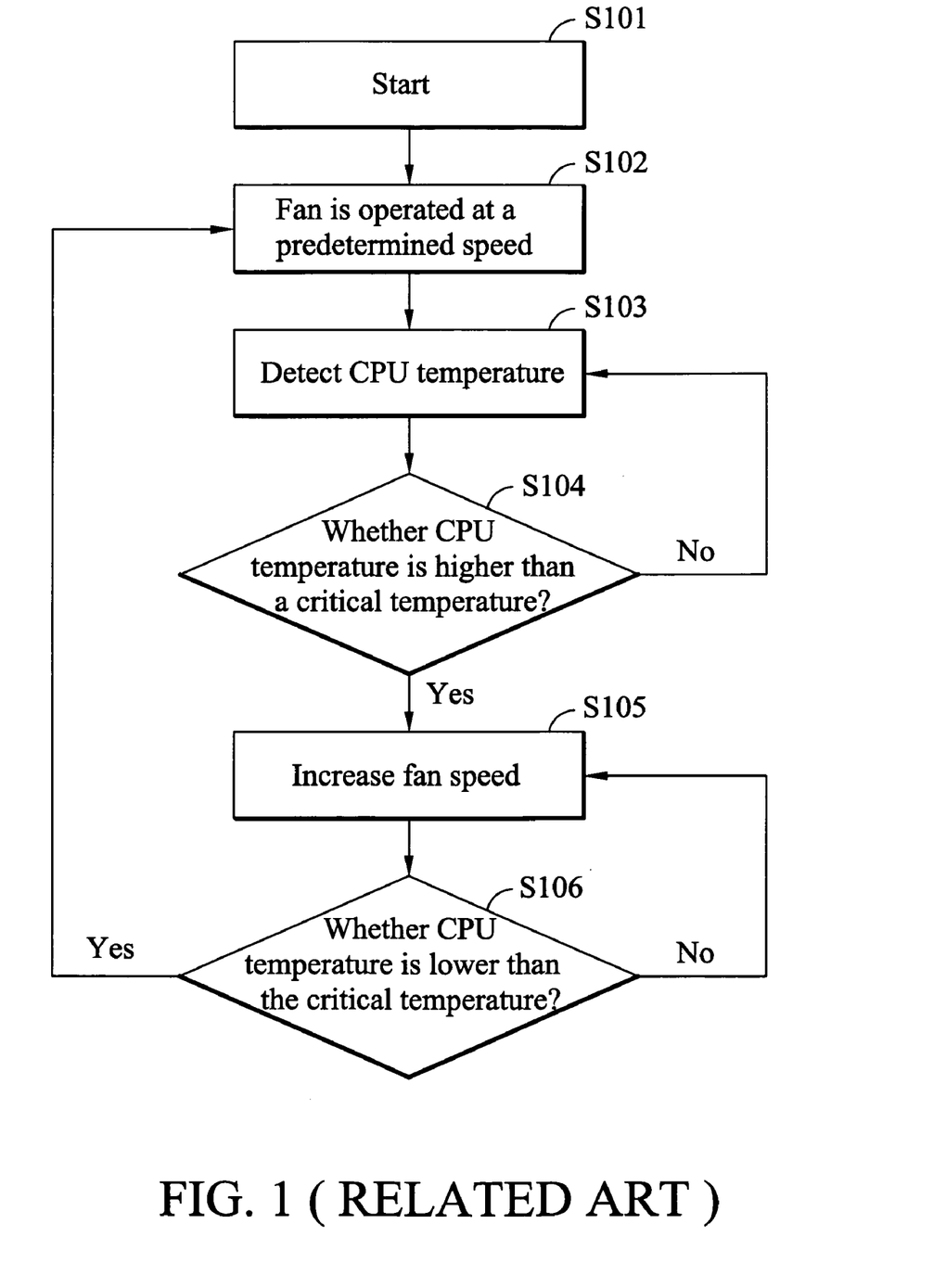
FIG. 1 is a flowchart of a fan controlling system of a conventional notebook.
Figure 2A:
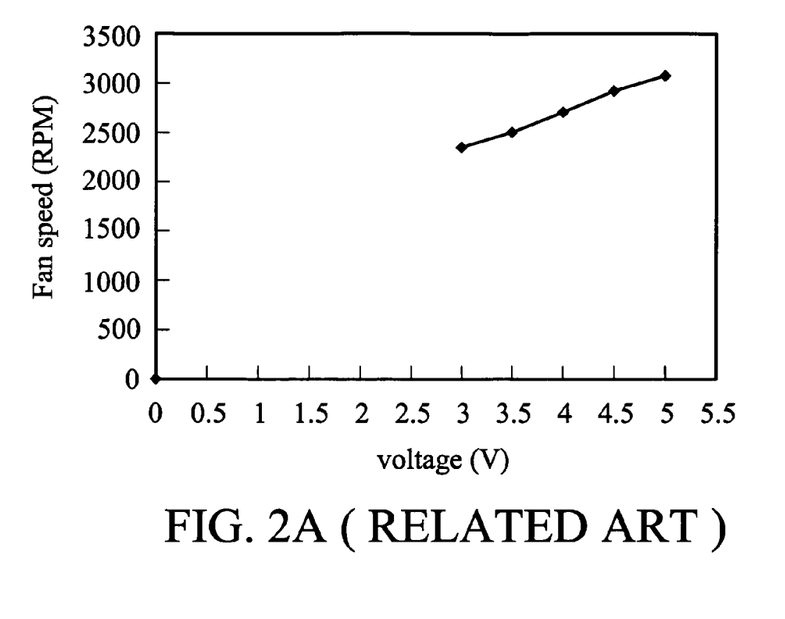
FIG. 2A is a plot showing the relationship between voltage and speed of a fan.
Figure 2B:
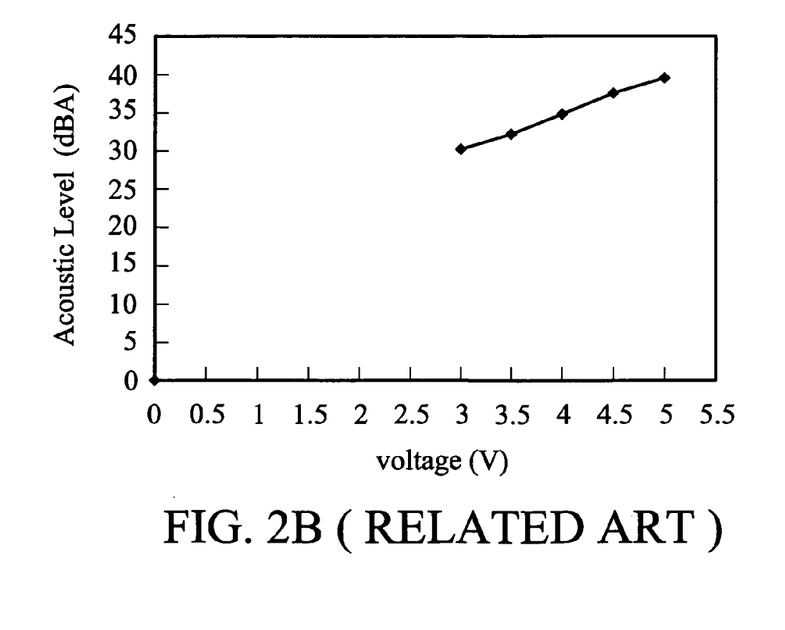
FIG. 2B is a plot showing the relationship between voltage and noise level of the fan.
Figure 2C:
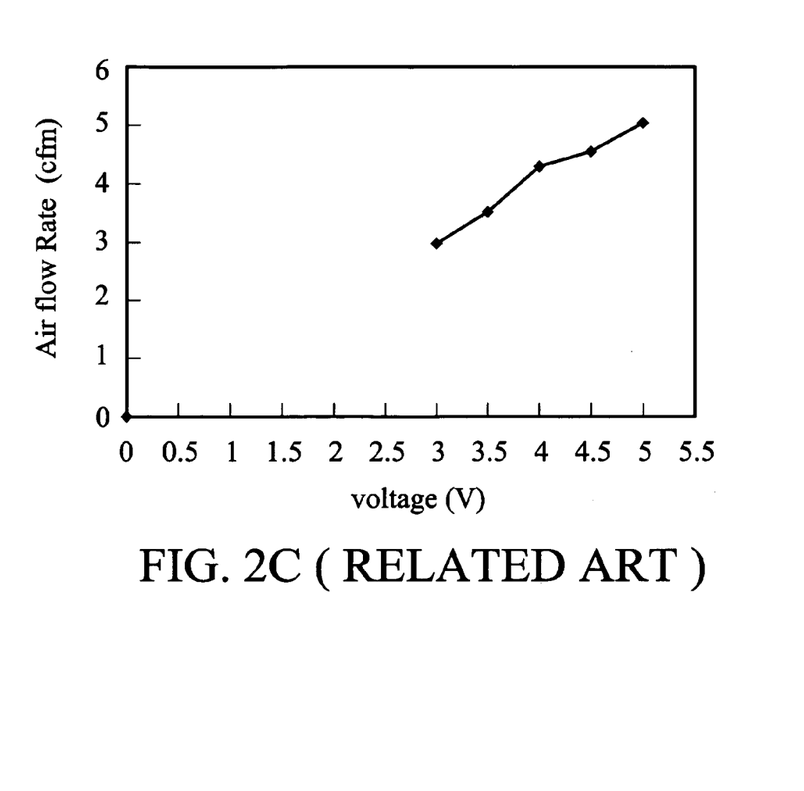
FIG. 2C is plot showing the relationship between voltage and airflow of the fan.
Figure 2D:
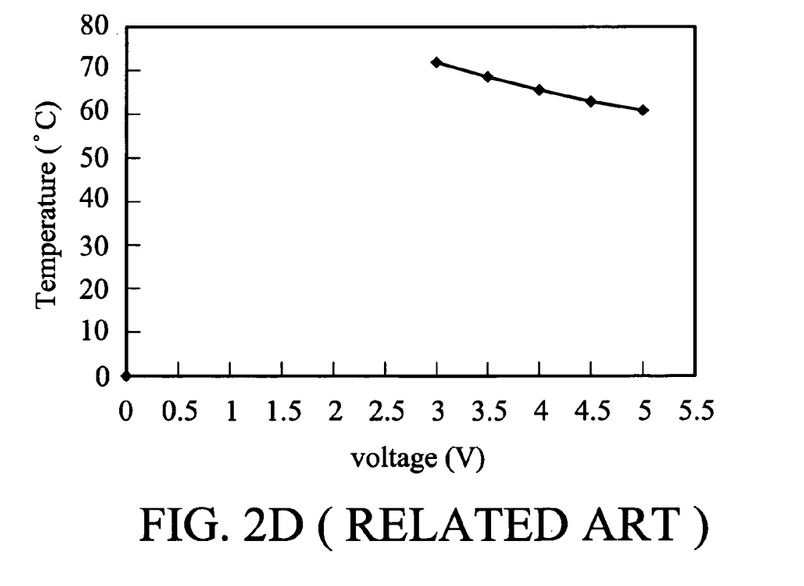
FIG. 2D is plot showing the relationship between voltage of the fan and temperature of an element.

FIG. 1 is a flowchart of a conventional fan controlling system of a notebook. As the notebook is started (step S101), the heat dissipating fan is operated at a predetermined speed to dissipate heat from the system (step S102). During operation, the temperature of the CPU is intermittently detected (step S103), and the system determines whether the CPU temperature is higher than a predetermined allowable temperature (step S104). When the CPU temperature is higher than the predetermined allowable temperature, the speed of fan is increased (step S105) to increase airflow, thereby facilitating heat dissipation. After a certain period of time, the system detects the CPU temperature again, checking whether the CPU temperature decreases below the allowable temperature (step S106) If the CPU temperature is less than the allowable temperature in step S106, the fan is kept at the same operating speed. If the CPU temperature is higher than the allowable temperature, the fan speed is increased, and the controlling process repeats.

With the same number of fans, airflow produced by the fans attempts to carry heat away from the system. In order to increase airflow, the speeds of fans must be increased by raising the driving voltage accordingly. However, as the speed of fan is increased, noise is inevitably produced thereafter. Thus, as heat is produced and temperature increases due to multiple elements in a system, to dissipate excess heat, the driving voltage must be increased to increase speed of fans, thereby producing enough airflow to carry excess heat away from the system. FIGS. 2A, 2B, 2C, 2D are plots of speed, noise level, airflow of the fan and temperature versus voltage. Thus, in a conventional fan controlling system, heat dissipation must be achieved at the cost of system noise level.

Using the fan controlling method mentioned above, when heat of the system is increased, it can be dissipated by increasing fan driving voltage, fan speed, and airflow, finally reducing system temperature. However, noise is followed by such a high fan speed, making users feel uncomfortable. Thus, there remains a need for a system that can increase heat dissipation without producing unpleasing noise.

SUMMARY OF THE INVENTION

An object of the invention is to provide a portable computer and a system controlling method thereof that can effectively solve the heat dissipation problem of a notebook and simultaneously control noise level within an acceptable range, without affecting system stability.

The present invention provides a portable computer. The portable computer includes a heat dissipating module, a microphone, a spectrum analysis module, and a controlling module. The heat dissipating module has a fan module. The fan module has a corresponding system acoustic level. The microphone collects surrounding noises, acoustically isolated from the fan module. The spectrum analysis module is connected to the microphone, analyzing the surrounding noises collected from the microphone to obtain a surrounding acoustic level. The controlling module has a predetermined temperature of the element, connected to the heat dissipating module and the spectrum analysis module, respectively. The predetermined temperature of the element substitutes for the maximum temperature, and the surrounding acoustic level substitutes for the maximum system acoustic level. Based on the maximum temperature and the maximum system acoustic level, an executive operating status is selected from a plurality of operating statuses, thereby obtaining corresponding system efficiency and fan driving voltage.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 3:
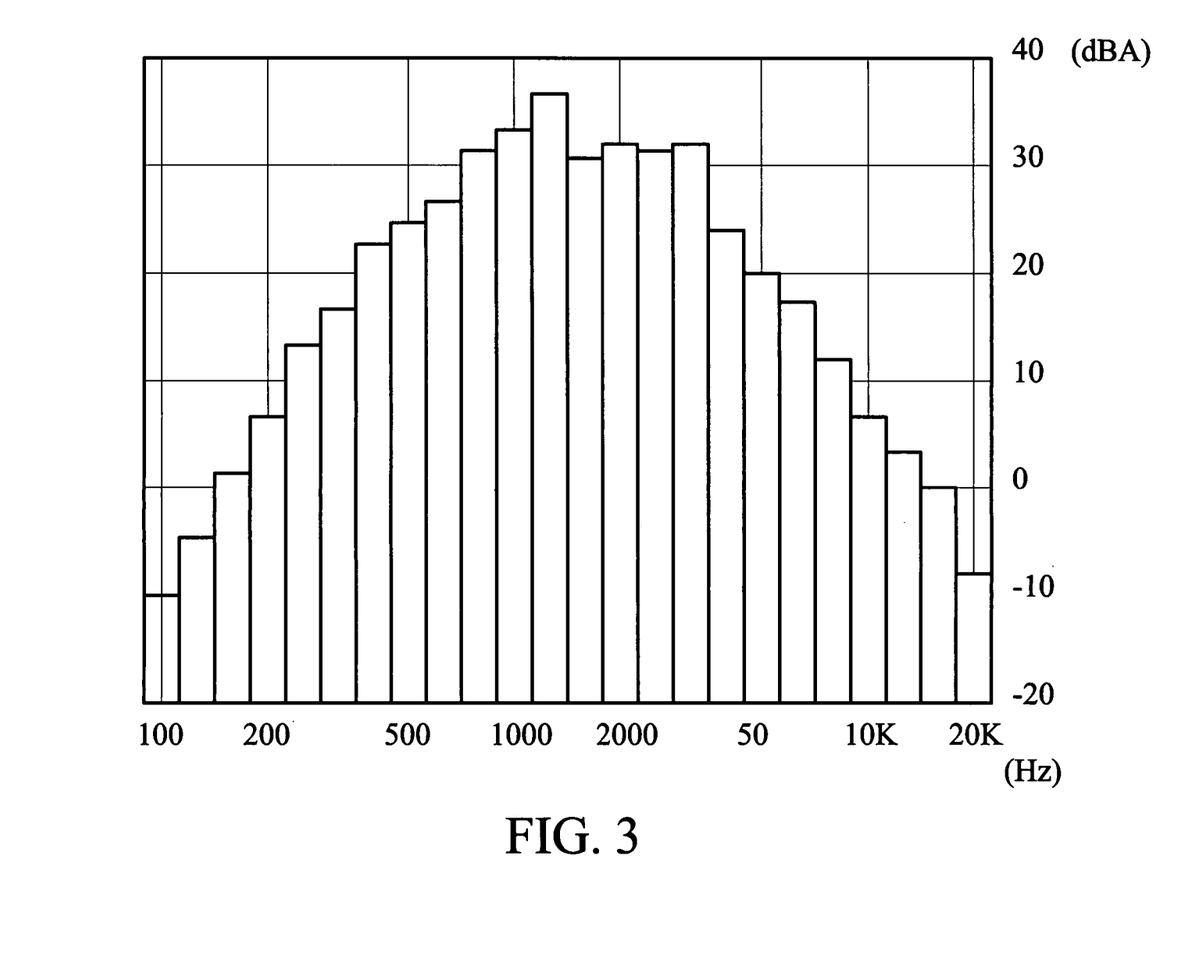
FIG. 3 is a spectrum diagram of the voltage.

Generally, hearing range of human beings is between 20 and 20000 Hz. According to this range, noise level is analyzed by frequency spectrum, as shown in FIG. 3, with a frequency band on the horizontal axis and a noise level on the vertical axis. In general, human beings can perceive acoustic variation between 3 dB and 5 dB. If noise level produced by fans in a portable computer is less than the surrounding noise level or less than the sum of the surrounding noise level plus a variation of 0–5 dB, in this case, noise of fan and background noise are substantially the same level for users; thus, this noise level from the fan would not disturb general users.

Figure 4:
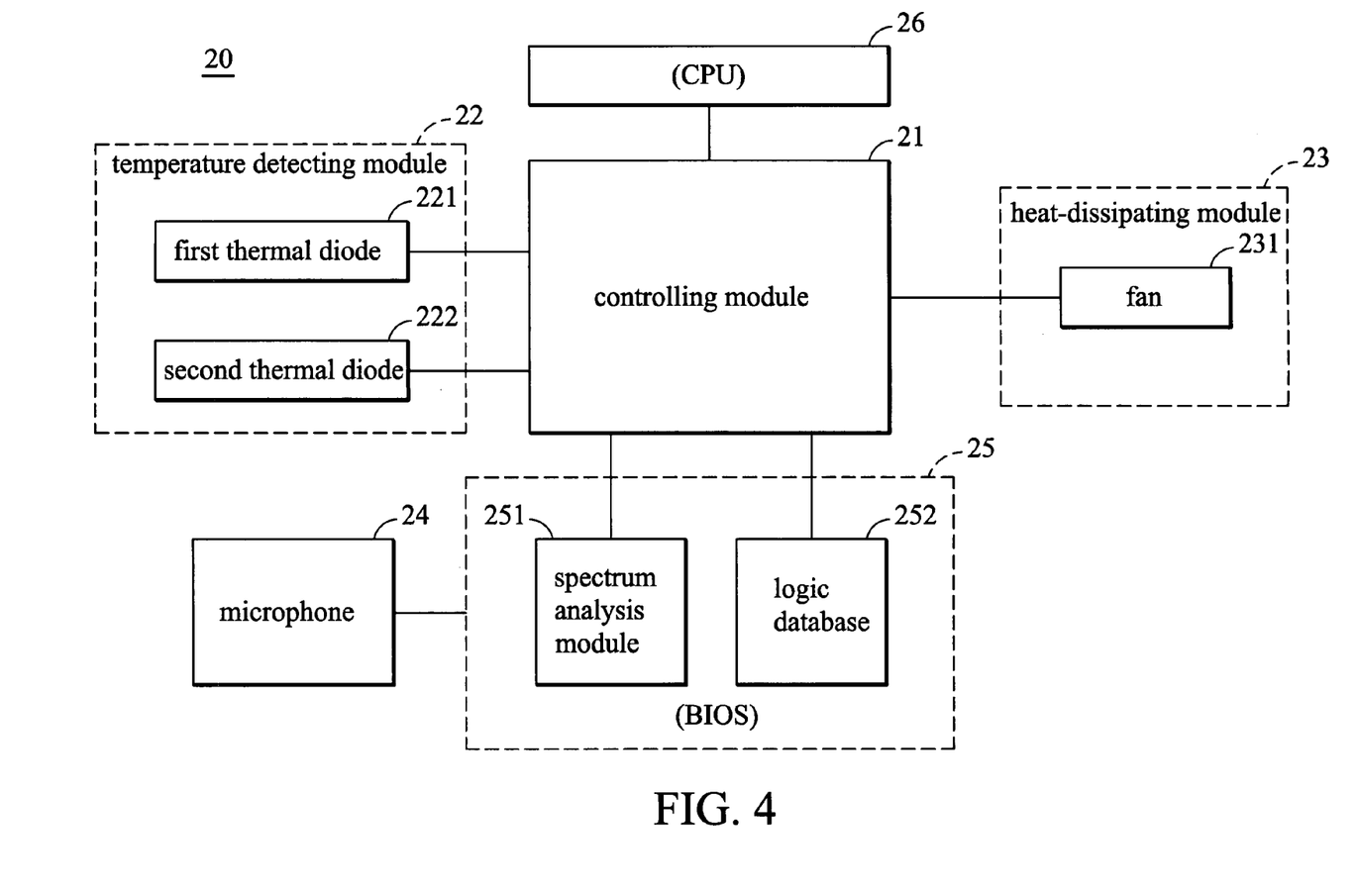
FIG. 4 is a block diagram according to a portable computer of the present invention.

FIG. 4 is a block diagram of the portable computer according to the present invention. The portable computer 20 has a CPU 26, a heat dissipating module 23, a temperature detecting module 22, a microphone 24, a BIOS 25, and a controlling module 21.

The heat dissipating module 23 includes a plurality of fins and a fan module 231. According to different demands of heat dissipation, the fan module 231 comprises different fans at different locations, carrying heat away from different parts of the system. Operations of such fan module 231 and airflow inevitably produce a noise; however, the invention can control and solve the noise problems mentioned above.

The temperature detecting module 22 includes a first thermal diode 221 and a second thermal diode 222, detecting temperature of the CPU 26 and the surroundings, respectively. The first and second thermal diodes 221, 222 may be substituted by other temperature detecting units such as a thermometer and a thermal couple.

The microphone 24 receives surrounding noise. To prevent noise from the fans in the system while recording, the microphone 24 is disposed at the furthest position from the fan module 231. An additional soundproof material, such as an acoustic absorption foam, may be used to acoustically isolate the microphone 24 from the system for accurate measurements.

In the BIOS 25, except input and output codes, there are also a spectrum analysis module 251 and a built-in logic database 252 included therein. The spectrum analysis module 251 analyses the collected surrounding noises from the microphone 24 and obtains a surrounding acoustic level by integration. The built-in logic database 252 has a plurality of operating statuses with experimental results. As shown in Table 1 below, under different surrounding temperature and different system efficiency and voltage conditions, each operating status includes a corresponding temperature of element and system acoustic level. The system efficiency represents the working frequency of the CPU in Hz. The element temperature in database represents the temperature of the CPU 26 under designated system efficiency and fan driving voltage. The system acoustic level is the noise level produced by the fan module 231 under designated fan driving voltage. The fan module 231 comprises a plurality of fans at different locations of the system. The fan module 231 with a plurality of fans and corresponding system acoustic levels is described hereinafter.

The following Table 1 shows the experimental results measured at a surrounding temperature of 25° C.

TABLE 1

| | | System efficiency | | |
|---|---|---|---|---|
| Fan driving voltage | | 50% | 75% | 100% |
| 3.0 V | Temperature (° C.) | 70.1 | 73.8 | 77.7 |
| | Acoustic level (dB) | 28.5 | 28.5 | 28.5 |
| 3.5 V | Temperature (° C.) | 68.1 | 70.7 | 74.0 |
| | Acoustic level (dB) | 31.4 | 31.4 | 31.4 |
| 4.0 V | Temperature (° C.) | 65.4 | 68.0 | 70.9 |
| | Acoustic level (dB) | 34.1 | 34.1 | 34.1 |
| 4.5 V | Temperature (° C.) | 63.3 | 66.4 | 67.7 |
| | Acoustic level (dB) | 36.8 | 36.8 | 36.8 |
| 5.0 V | Temperature (° C.) | 61.5 | 63.0 | 65.8 |
| | Acoustic level (dB) | 38.2 | 38.2 | 38.2 |

The controlling module 21 has an adjustable predetermined temperature of the element. The predetermined temperature of the element represents the maximum temperature of the CPU 26 in the portable computer 20. If the CPU temperature is greater than the maximum temperature, the system becomes unstable, further causing computer crashes. Moreover, based on the predetermined temperature of the element and surrounding acoustic levels, the controlling module 21 determines the maximum temperature and the maximum system acoustic level, such as making the predetermined temperature of the element and surrounding acoustic level equal to the maximum temperature and the maximum system acoustic level, respectively. Finally, an executive operating status is chosen by the logic database 252 built in the BIOS 25, and then the corresponding system efficiency and the fan driving voltage are determined so that the portable computer 20 has a lower system noise level and the highest system efficiency.

In addition, the controlling module 21 in the portable computer 20 of the present invention, as shown in FIG. 4, may also be independently disposed outside the BIOS 25 as a single chip disposed on the motherboard, or integrated into the BIOS 25 so that the BIOS 25 has a complete controlling function for choosing the operating status.

Figure 5A:
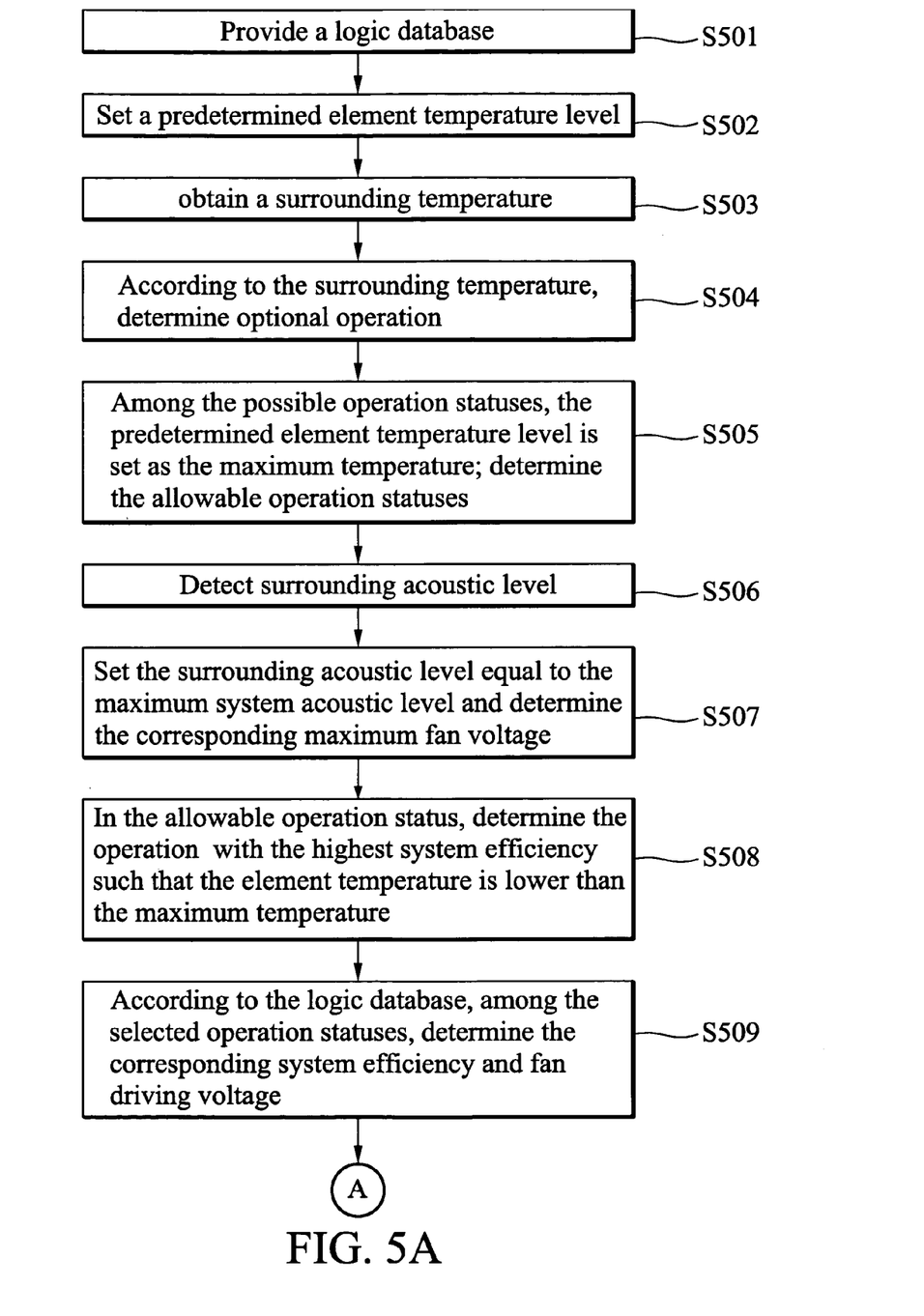
FIG. 5A~5B is a flowchart of system controlling method according to the portable computer of the present invention.
Figure 5B:
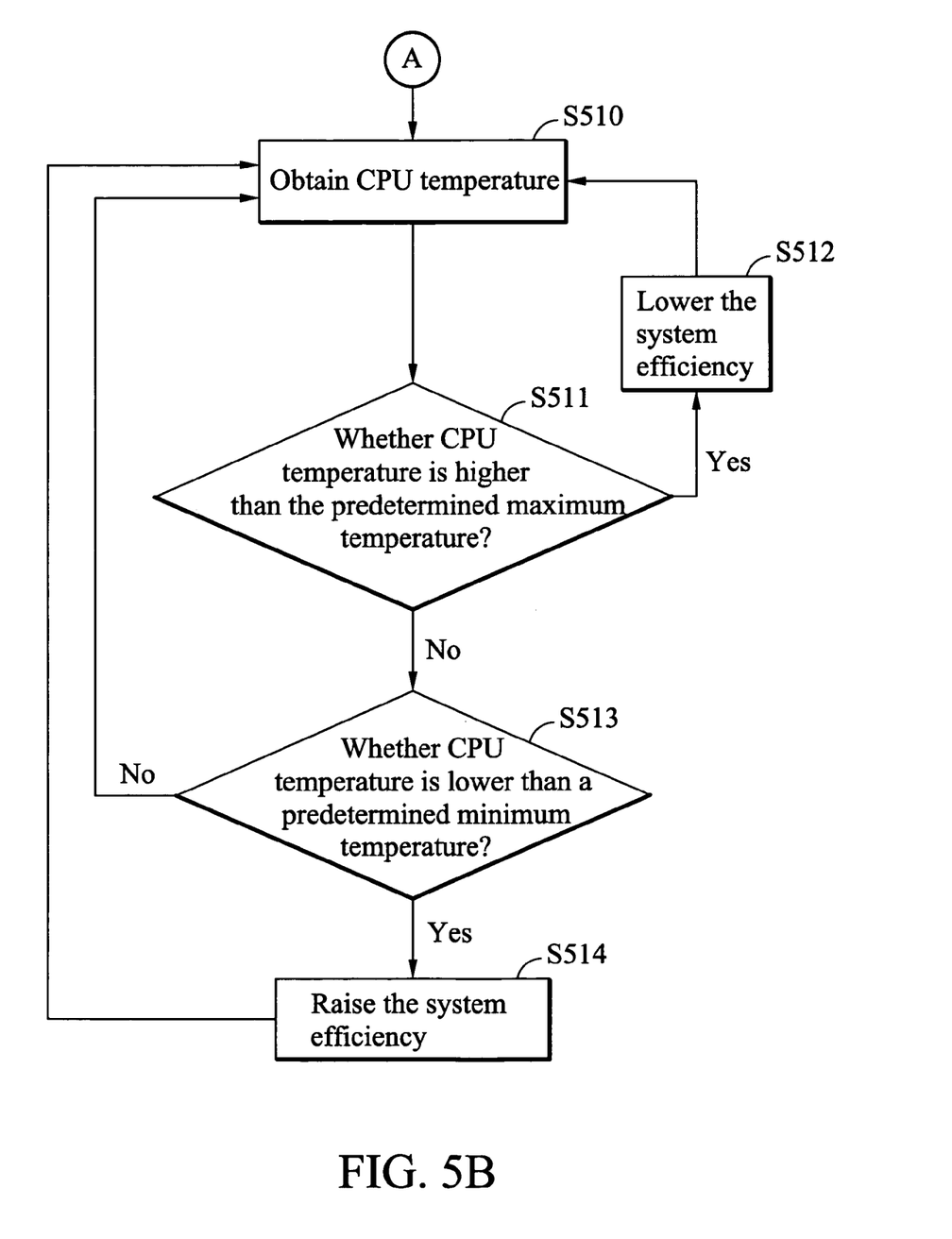

FIGS. 5A to 5B constitute a flowchart of the system controlling method to control operating status of the portable computer. In FIG. 4 and FIGS. 5A to 5B, to achieve appropriate system noise level, during production of the portable computer 20, the logic database 252 is built in the BIOS 25. The logic database 252 has a plurality of operating statuses. Under different surrounding temperatures, for a predetermined system efficiency and a fan driving voltage, each operating status has a corresponding set of temperature and acoustic level (step S501). The controlling module 21 may set a predetermined temperature of the element (step S502) such as 72° C. The predetermined temperature of the element is a default temperature before the computer is put on market. Also, the maximum temperature (predetermined temperature of the element) for the CPU 26 can be changed manually in the BIOS 25. Next, the controlling module 21 obtains a surrounding temperature (step S503) by the first thermal diode 221. The controlling module 21 determines possible operating statuses according to the surrounding temperature (step S504). For example, when the surrounding temperature is 25° C., the logic database 252 has chosen a data table as shown in Table 1, providing a reference for the controlling module 21 to determine available operating statuses.

As shown in FIG. 5, after the system has chosen the possible operating statuses, the controlling module 21 according to the maximum temperature (predetermined temperature of the element) determines a plurality of allowable operating statuses among the possible operating statuses (step S505). That is, the controlling module 21, according to the predetermined temperature of the element, deletes the operating statuses with temperature higher than 72° C., as shown in Table 2, leaving the allowable ones in the table. As shown in Table 2, the remaining ones are the allowable operating statuses in this embodiment.

TABLE 2

| | | System efficiency | | |
|---|---|---|---|---|
| Fan driving voltage | | 50% | 75% | 100% |
| 3.0 V | Temperature (° C.) | 70.1 | | |
| | Acoustic level (dB) | 28.5 | | |
| 3.5 V | Temperature (° C.) | 68.1 | 70.7 | |
| | Acoustic level (dB) | 31.4 | 31.4 | |
| 4.0 V | Temperature (° C.) | 65.4 | 68.0 | 70.9 |
| | Acoustic level (dB) | 34.1 | 34.1 | 34.1 |

TABLE 2-continued

| Fan driving voltage | | System efficiency | | |
| --- | --- | --- | --- | --- |
| | | 50% | 75% | 100% |
| 4.5 V | Temperature (° C.) | 63.3 | 66.4 | 67.7 |
| | Acoustic level (dB) | 36.8 | 36.8 | 36.8 |
| 5.0 V | Temperature (° C.) | 61.5 | 63.0 | 65.8 |
| | Acoustic level (dB) | 38.2 | 38.2 | 38.2 |

After the maximum temperature is determined, as shown in Table 2, the microphone 24 starts receiving surrounding noises, and the spectrum analysis module 251 in the BIOS 25 starts analyzing the noise from the microphone 24, such that a surrounding acoustic level is obtained (step S506). For example, the surrounding acoustic level is a value calculated by summing the background acoustic level and the sound difference perceptible by human beings. Next, the controlling module 21 sets the surrounding acoustic level equal to the maximum acoustic level (step S507), and determines the corresponding maximum fan driving voltage. Among the allowable operating statuses, the executive operating status must have the highest system efficiency with a temperature lower than the maximum temperature (step S508). The operating status is the one set for the system, and the corresponding system efficiency (CPU frequency) and fan driving voltage (step S509) are also obtained.

To describe the above mentioned system controlling method in more details, different surrounding acoustic levels are provided as examples for further explanation as follows.

When a surrounding acoustic level recorded by the microphone is found to be lower than 28.5 dB, according to Table 2 and controlling logic of operating status, without affecting system stability, the system is only able to perform at 50% efficiency under fan driving voltage of 3V. As a result, the system has the lowest noise level unnoticed by users.

When the surrounding acoustic level from the microphone is found to be 29 dB, according to Table 2 and controlling logic of operating status, the system must perform at 50% efficiency under fan driving voltage of 3V.

When the surrounding acoustic value is found to be 33 dB, according to Table 2 and controlling logic of operating status, the system must perform at 75% efficiency under fan driving voltage of 3.5V.

When the surrounding acoustic level is found to be 36 dB, according to Table 2 and controlling logic of operating status, the system must perform at 100% efficiency under fan driving voltage of 4V. When the system performs at 100% efficiency, giving higher fan driving voltage and speed, even the system acoustic level is increased accordingly, the system acoustic level is about the same as the surrounding acoustic level so that the noise produced by the fan is unheard by users; and thus, the system could be performed at the highest efficiency.

As shown in FIGS. 4 and 5, after the controlling module 21 has done the setup of operating status as mentioned above, the controlling module 21 obtains the temperature of the CPU by the second thermal diode 222 (step S510), continuously checking whether CPU temperature is higher than the predetermined temperature of the element (step S511). Meanwhile, when the CPU temperature is higher than the predetermined temperature of the element (72° C.), the controlling module 21 reduces the working frequency of CPU to lower the system efficiency (step S512). Thus, the temperature of the CPU is measured periodically for continuous temperature detection.

When the CPU temperature is lower than the predetermined temperature of the element (72° C.), the controlling module 21 determines whether the CPU temperature is lower than a minimum temperature (step S513). Namely, the controlling module 21 checks whether the CPU temperature is lower than the temperature corresponding to the current system efficiency. If the CPU temperature is higher than the temperature corresponding to the current system efficiency, the controlling module 21 continues monitoring the temperature of CPU (step S510). If the CPU temperature is lower than a minimum temperature, that means the CPU temperature is lower than the temperature corresponding to the current system efficiency, the heat dissipation is good enough so that the working frequency of CPU may be increased a little bit more to achieve better system efficiency (step S514). After a predetermined period, the CPU temperature is detected again (step S510). For example, when the system is set to have an efficiency of 75% under fan driving voltage of 3.5 V, if at this moment the temperature of CPU Is found to be 60° C., and the temperature of such operating status in Table 2 is 70.7° C., with minimum temperature of 68° C., since the current CPU temperature of 60° C. is below the minimum temperature of 68° C., the working frequency of CPU should be increased for better efficiency.

Figure 6A:
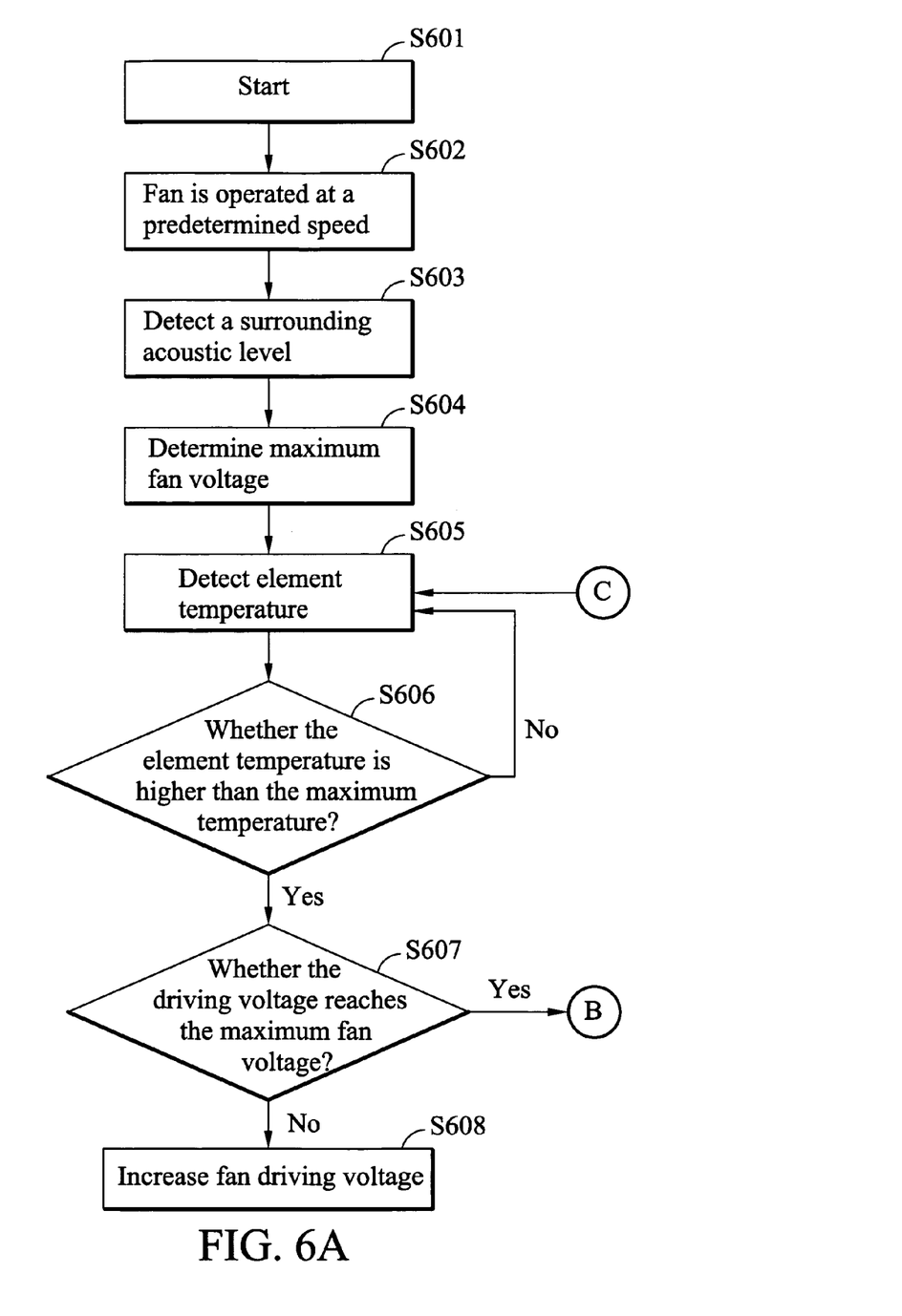
FIG. 6A~6B is another flowchart of system controlling method according to the portable computer of the present invention.
Figure 6B:
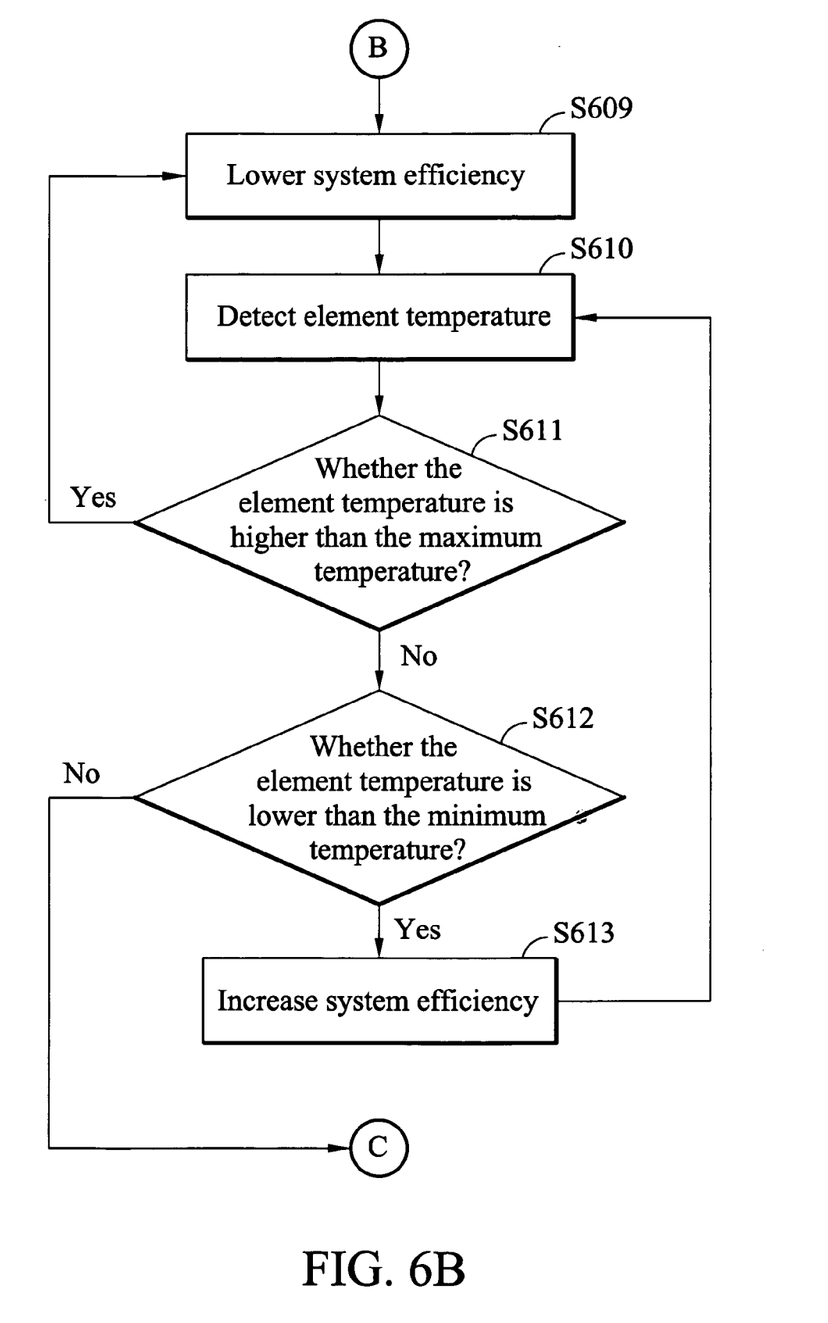

FIGS. 6A to 6B constitute a flowchart of the system controlling method according to another embodiment of the present invention. As stated above, a logic database 252 is built in the portable computer 20, having a plurality of operating statuses. Under different surrounding temperature and different system efficiency and voltage conditions, each operating status includes a corresponding temperature of element and system acoustic level. Also a maximum temperature is set as a default value before the portable computer 20 is put on market or users may change this value accordingly. After the portable computer 20 is started (step S601), the fan in the system starts operating at a predetermined speed (step S602).

Next, the microphone 24 collects the surrounding noise and the spectrum analysis module 251 converts the recorded noise into a surrounding acoustic level (step S603). According to the surrounding acoustic level, a corresponding maximum voltage is set (step S604) so that the system acoustic level produced by the fan module is maintained below the surrounding acoustic level. Instead, the user may manually setup the maximum voltage (step S604), for example, the user may change the settings of maximum voltage in BIOS after the computer is started. Under such condition, the step S603 can be omitted.

After setting up the maximum voltage (step S604), the temperature detecting module 22 obtains the temperature of CPU (step S605) and checks whether CPU temperature is higher than the predetermined maximum temperature (step S606). When the CPU temperature is not higher than the predetermined maximum temperature, that means the heat dissipation is under control; and thus, the CPU temperature detection may be delayed for a certain period of time thereafter (step S605). If the CPU temperature is higher than the predetermined maximum temperature, the controlling module 21 must increase the fan driving voltage to increase speed thereof, and thereby increasing the airflow for better heat dissipation. Also, the driving voltage of the fan module must be checked whether it is over the maximum voltage (step S607).

If the fan driving voltage does not reach the maximum voltage, the driving voltage can be further increased (step S608). Then the CPU temperature is detected again after a period (S605). If the fan driving voltage reaches the maximum voltage, then the system efficiency is decreased (step S609) to reduce the heat generated by the system.

When the fan driving voltage exceeds the maximum voltage after the system efficiency is decreased, the CPU temperature is detected again after a period (step S610). Next, the controlling module 21 determines whether the CPU temperature is higher than the predetermined temperature of the element (maximum temperature) (step S611). If the CPU temperature is higher than the maximum temperature, that means heat dissipation is not sufficient, and further reduction in system efficiency is required (back to step S609). If the CPU temperature does not exceed the maximum temperature, then the system must judge whether CPU temperature is lower than the temperature corresponding to the system efficiency or the minimum temperature (step S612).

If the CPU temperature is lower than the minimum temperature, heat is dissipated to an acceptable level. Thus, the working frequency of CPU may be increased again to achieve better system efficiency (step S613). After a period, the CPU temperature is detected again (step S610). If the CPU temperature does not decrease below the temperature corresponding to the system efficiency, the system is operated at its highest efficiency and the lowest noise level. After a period, the CPU temperature is measured again (step S605) to repeatedly control the operating status so that the portable computer 20 is maintained at negligible system noise level and performs at its maximum efficiency.

In addition, during monitoring process in the system controlling method, the controlling module 21 can be stopped by any interrupt function of the system, obtaining an updated surrounding acoustic level periodically or anytime. The system resets the maximum system acoustic level. Thus, the portable computer 20 of the present invention maintains the system in the lowest possible noise level, at the highest system efficiency.

Moreover, the maximum system acoustic level equals to the sum of the surrounding acoustic level and an adjusting value, which is between 0 and 5 dB. Users may adjust this value in the BIOS according to different situations.

The system controlling method of the present invention is a dynamic feedback controlling method, without affecting system stability, the noise produced by the fan module is reduced to an acceptable range for users, thereby preventing any noise interference.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A portable computer, comprising:
   a heat dissipating module having a fan module, wherein the fan module has a corresponding system acoustic level;
   a microphone, collecting surrounding noises, acoustically isolated from the fan module;
   a spectrum analysis module, connected to the microphone, analyzing the surrounding noises collected from the microphone to obtain a surrounding acoustic level; and
   a controlling module having a predetermined temperature of the element, connected to the heat dissipating module and the spectrum analysis module, respectively, wherein the predetermined temperature of the element is set as the maximum temperature, and the surrounding acoustic level is set as the maximum system acoustic level so that an executive operating status is selected from a plurality of operating statuses according to the maximum temperature and maximum system acoustic level, thereby obtaining a corresponding system efficiency and a fan driving voltage.

2. The portable computer as claimed in claim 1, further comprising a built-in logic database, having the operating statuses, connected to the controlling module, and the operating statuses include predetermined system efficiencies and fan driving voltages, with corresponding element temperatures and system acoustic levels.

3. The portable computer as claimed in claim 2, wherein the spectrum analysis module and the logic database are built in a BIOS.

4. The portable computer as claimed in claim 2, further comprising a central processing unit, connected to controlling module, wherein the system efficiencies represent a plurality of working frequencies of the central processing unit, and the element temperatures are the temperatures of the central process unit.

5. The portable computer as claimed in claim 4, further comprising a temperature detecting module, connected to the controlling module, detecting the temperature of the central processing unit.

6. The portable computer as claimed in claim 5, wherein the temperature detecting module, connected to the controlling module, detecting the surrounding temperature thereof.

7. The portable computer as claimed in claim 5, wherein the temperature detecting module comprises a thermal diode.

8. The portable computer as claimed in claim 5, wherein the operating statuses of the logic database further include surrounding temperatures, and among the operating statuses, the controlling module determines a plurality of allowable operating statuses according to the surrounding temperatures detected by the temperature detecting module.

9. The portable computer as claimed in claim 1, wherein the fan module comprises a plurality of fans.

10. A system controlling method of a portable computer, the method comprising the steps of:
    providing a logic database, having a plurality of operating statuses, wherein each operating status has a predetermined system efficiency and a fan driving voltage, with a corresponding element temperature and system acoustic level;
    setting a predetermined temperature of the element;
    setting the predetermined temperature of the element equal to a maximum temperature, and among the operating statuses, determining a plurality of allowable operating statuses;
    detecting a surrounding acoustic level;
    setting the surrounding acoustic level equal to a maximum system acoustic level, and among the allowable operating statuses, determining an executive operating status; and
    according to the logic database, from the executive operating status, determine the corresponding system efficiency and fan driving voltage.

11. The method as claimed in claim 10, wherein among the allowable operating statuses, the executive operating status has the highest system efficiency.

12. The method as claimed in claim 10, further comprising the steps of:
   obtaining a surrounding temperature; and
   according to the surrounding temperature, determining possible operating statuses.

13. The method as claimed in claim 10, further comprising the steps of:
   obtaining an element temperature; and
   when the element temperature is higher than the predetermined temperature of the element, the system efficiency is lowered.

14. The method as claimed in claim 13, further comprising the steps of:
   when the element temperature is less than the temperature corresponding to the system efficiency, the system efficiency is increased.

15. A system controlling method of a portable computer, the method comprising the steps of:
   providing a logic database, having a plurality of allowable operating statuses, wherein each allowable operating status has a predetermined maximum temperature, a minimum temperature, a system efficiency, and a fan driving voltage, with corresponding element temperature and system acoustic level;
   setting a maximum driving voltage;
   detecting an element temperature; and
   according to the allowable operating statuses, the element temperature and the predetermined maximum temperature, the fan driving voltage and the maximum driving voltage, adjusting the corresponding system efficiency and the fan driving voltage.

16. The method as claimed in claim 15, wherein the step of setting a maximum driving voltage comprises the steps of:
   detecting a surrounding acoustic level; and
   according to the logic database, among the allowable operating statuses, setting the surrounding acoustic level equal to a maximum system acoustic level, and determining the maximum driving voltage.

17. The method as claimed in claim 15, further comprising a step after detecting the element temperature;
   when the element temperature is higher than the maximum temperature, and the fan driving voltage has not reached the maximum driving voltage, raising the fan driving voltage.

18. The method as claimed in claim 15, further comprising a step after detecting the element temperature;
   when the element temperature is higher than the maximum temperature, and the fan driving voltage has reached the maximum driving voltage, lowering the system efficiency.

19. The method as claimed in claim 18, further comprising a step after lowering the system efficiency;
   detecting the element temperature; and
   when the element temperature is higher than the maximum temperature, lowering the system efficiency.

20. The method as claimed in claim 19, further comprising the steps of:
   when the element temperature is less than the minimum temperature corresponding to the system efficiency, raising the system efficiency.

* * * * *